| (12) | United States Patent | (10) Patent No.: | US 10,450,647 B2 |
|---|---|---|---|
| | Sykora et al. | (45) Date of Patent: | Oct. 22, 2019 |

(54) HARD AND LOW FRICTION NITRIDE COATINGS

(75) Inventors: Frank Sykora, Caledon (CA); Ali Erdemir, Naperville, IL (US); Mustufa Urgen, Istanbul (TR); Osman Levent Eryilmaz, Plainfield, IL (US)

(73) Assignee: Galleon International Corporation, Southfield, MI (US)

( * ) Notice: Subject to any disclaimer, the term of this patent is extended or adjusted under 35 U.S.C. 154(b) by 874 days.

(21) Appl. No.: 13/992,466

(22) PCT Filed: Dec. 8, 2010

(86) PCT No.: PCT/US2010/059500

§ 371 (c)(1),
(2), (4) Date: Oct. 9, 2013

(87) PCT Pub. No.: WO2012/078151

PCT Pub. Date: Jun. 14, 2012

(65) Prior Publication Data

US 2014/0295128 A1    Oct. 2, 2014

(51) Int. Cl.
*C23C 14/34* (2006.01)
*C23C 14/35* (2006.01)
(Continued)

(52) U.S. Cl.
CPC .......... *C23C 14/35* (2013.01); *C23C 14/0641* (2013.01); *C23C 14/0688* (2013.01);
(Continued)

(58) Field of Classification Search
CPC . C23C 14/06; C23C 14/0617; C23C 14/0641; C23C 14/0682; C23C 14/14; C23C 14/35; C23C 14/54
See application file for complete search history.

(56) References Cited

U.S. PATENT DOCUMENTS

| 4,478,703 A | * | 10/1984 | Edamura et al. | ........ 204/298.28 |
| 5,037,522 A | * | 8/1991 | Vergason | ................. 204/298.41 |

(Continued)

FOREIGN PATENT DOCUMENTS

| EP | 1184480 A2 | 6/2002 |
| JP | 2004091907 A | 3/2004 |

(Continued)

OTHER PUBLICATIONS

International Search Report dated Sep. 1, 2011 from corresponding PCT Application No. PCT/US2010/059500, dated Dec. 8, 2010, 9 pages.

(Continued)

*Primary Examiner* — Jason Berman
(74) *Attorney, Agent, or Firm* — Brooks Kushman P.C.

(57) ABSTRACT

A hard, wear resistant coating and a method of forming the coating on a substrate to be exposed to hydrocarbons is provided. A substrate is provided in a chamber. A film is deposited onto the substrate by physical vapor deposition (PVD), where the film includes a bulk layer and an outer termination layer. The deposition of the termination layer is mitigated. The termination layer is removed from the film, leaving the remaining bulk layer disposed over the substrate. And when the substrate is exposed to hydrocarbons in an environment having wear additives, friction modifiers, or naturally occurring compounds, a durable tribological layer is formed on an outer surface of the bulk layer to create a coating having low friction and anti-wear properties.

23 Claims, 6 Drawing Sheets

(51) Int. Cl.
*C23C 14/06* (2006.01)
*C23C 14/58* (2006.01)

(52) U.S. Cl.
CPC ...... *C23C 14/3414* (2013.01); *C23C 14/5873* (2013.01); *Y10T 428/239* (2015.01)

(56) References Cited

U.S. PATENT DOCUMENTS

| | | |
|---|---|---|
| 5,540,750 A | 7/1996 | Fernandez et al. |
| 5,622,525 A | 4/1997 | Haisma et al. |
| 5,656,383 A | 8/1997 | Tanaka et al. |
| 5,830,531 A | 11/1998 | Bergmann |
| 6,583,053 B2 | 6/2003 | Lu et al. |
| 6,599,400 B2 | 7/2003 | Strondl et al. |
| 6,887,562 B2* | 5/2005 | Hugosson ............ 428/212 |
| 7,211,323 B2* | 5/2007 | Erdemir et al. ......... 428/323 |
| 7,674,707 B2 | 3/2010 | Russell et al. |
| 2004/0026402 A1* | 2/2004 | Ito et al. ............ 219/444.1 |
| 2007/0000770 A1 | 1/2007 | Yamamoto |
| 2007/0284255 A1* | 12/2007 | Gorokhovsky et al. ...... 205/89 |
| 2008/0233388 A1* | 9/2008 | Morita et al. ............ 428/336 |
| 2009/0087673 A1 | 4/2009 | Taylor et al. |

FOREIGN PATENT DOCUMENTS

| | | |
|---|---|---|
| JP | 2004099966 | 4/2004 |
| JP | 2005015852 | 1/2005 |
| JP | 2006008853 | 1/2006 |
| JP | 2007009310 | 1/2007 |
| JP | 2007270205 A | 10/2007 |
| JP | 2008031517 A | 2/2008 |
| JP | 2008240079 A | 10/2008 |

OTHER PUBLICATIONS

Japanese Office Action for Application No. JP 2013-543138, dated May 28, 2014, 5 Pages.

* cited by examiner

HARD AND LOW FRICTION NITRIDE COATINGS

TECHNICAL FIELD

One or more embodiments relate to nitride coatings and methods for forming nitride coatings having high hardness, smooth surfaces, low friction and low wear properties.

BACKGROUND

Complex machines, such as internal combustion engines, include internal operating environments characterized by high temperatures and high pressure. Components operating in such environments are often coated to provide hard surfaces with low friction properties. Liquid hydrocarbons (e.g., fuel, oil and lubricants) are circulated within the environments during operation. Such liquid hydrocarbons often include additives to optimize the performance of the machine and preserve the coated components. The additives add cost to the liquid hydrocarbons, and may result in undesirable emissions and waste disposal issues.

There are a variety of known processes for coating products for use in such operating environments. Physical vapor deposition (PVD) is one example of such a coating process. PVD is a general term used to describe any of a variety of methods to deposit thin films or coatings, by the condensation of a vaporized form of the material onto a substrate. There are several different types of PVD processes, including: sputtering, cathodic arc deposition, pulsed laser deposition, evaporative deposition, electron beam physical vapor deposition and magnetron sputtering. Sputtering is often used when it is desirable to deposit an alloy of two or more materials at a time. Magnetron sputtering may be used to control the deposition area and to achieve high deposition rates.

U.S. Pat. No. 7,211,323 to Erdemir et al. discloses examples of hard, low friction nitride coatings formed using PVD techniques such as cathodic arc discharge, ion-plating, magnetron sputtering and laser ablation.

SUMMARY

In at least one embodiment, a method of forming a coating on a substrate to be exposed to hydrocarbons is provided. A substrate is provided in a chamber. A film is deposited onto the substrate by physical vapor deposition (PVD), where the film includes a bulk layer and an outer termination layer. The deposition of the termination layer is mitigated. The termination layer is then removed from the film, leaving the remaining bulk layer disposed over the substrate. And when the substrate is exposed to hydrocarbons in an environment having at least one of wear additives, friction modifiers and naturally occurring compounds, a durable tribological layer is formed on an outer surface of the bulk layer to create a coating having low friction and anti-wear properties.

In another embodiment, a hard, wear resistant bulk coating is provided. The bulk coating is deposited on a substrate and includes a hard molybdenum-nitride having a grain size of 5 to 100 nm with copper distributed around the molybdenum-nitride grains. Wherein the bulk coating has a hardness of at least 2,000 Vickers (HV) and is adapted to scavenge, concentrate and chemically bond with at least one of additives, modifiers and naturally occurring compounds from within a surrounding environment to form a continuously replenishing tribological layer between the bulk coating and a counterface.

In yet another embodiment, an article is provided with a body having a substrate surface. A bulk coating is deposited on the substrate surface. The bulk coating is made up of about 50 to 99.7 wt. % molybdenum-nitride and 0.1 to 50 wt. % copper. The bulk coating has a hardness of at least 2,000 Vickers (HV). A tribological layer formed between the bulk coating and an adjacent counterface. The tribological layer is formed by chemically bonding between the bulk coating and at least one of additives, modifiers and naturally occurring compounds within a surrounding environment, wherein the tribological layer is adapted for continuous replenishment.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

In general, a system is provided for forming a coating having low friction properties on a product. The coated product is adapted for operating in an environment having high temperature and high pressure (e.g. within an engine). The coated product is further adapted to scavenge additives, modifiers or naturally occurring compounds from the liquid hydrocarbons to form a tribological layer; thereby allowing for a reduction in the amount of additives used.

Figure 1:
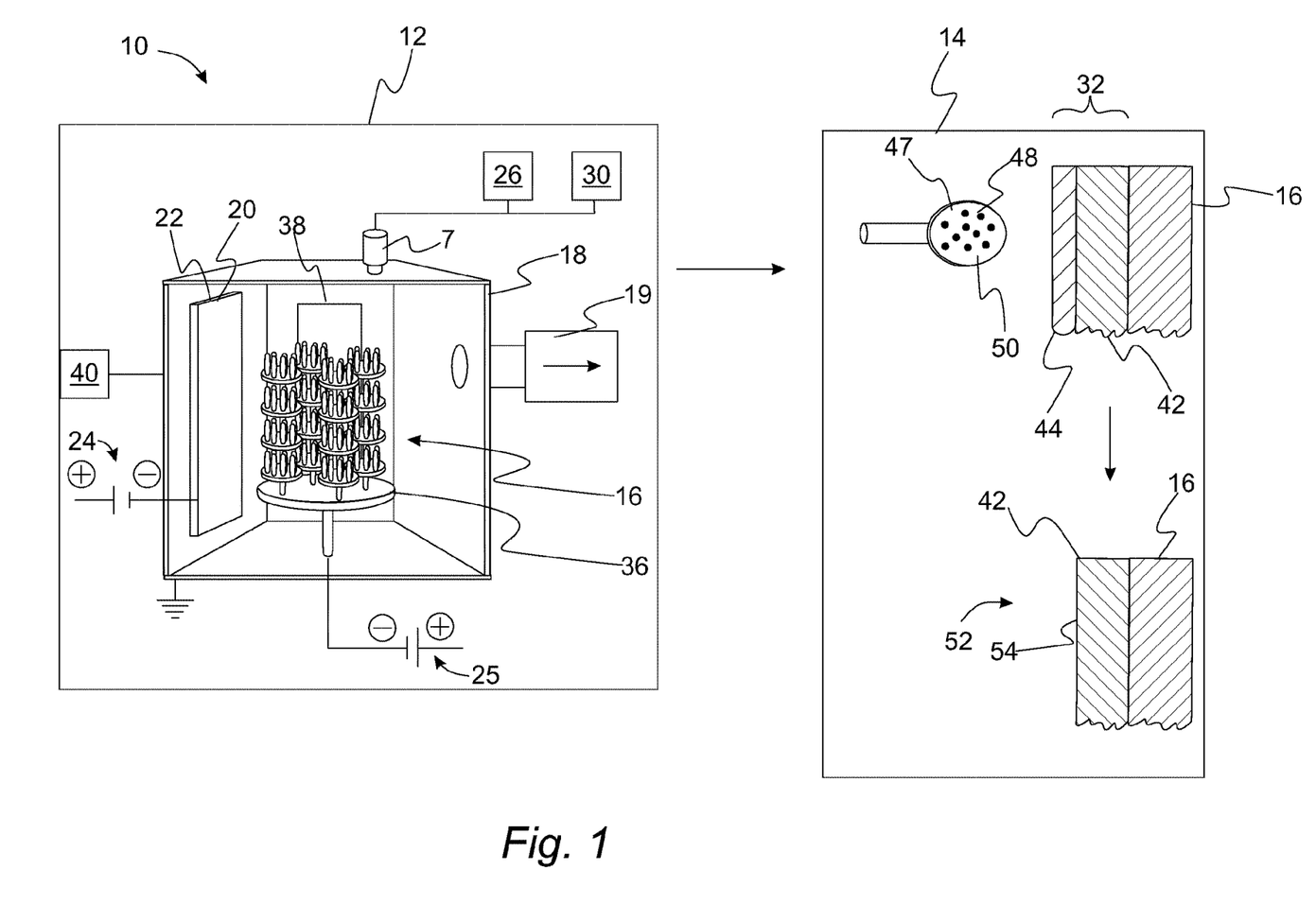
FIG. 1 is a schematic view of a system for forming a nitride coating on a substrate according to at least one embodiment of the present invention.

With reference to FIG. 1, a system for forming a coating on a substrate is illustrated in accordance with an embodiment and is generally referenced by numeral 10. The system 10 includes a physical vapor deposition (PVD) apparatus 12 and a material removal apparatus 14.

The PVD apparatus 12 may be selected from several known processes, such as ARC PVD, Magnetron Sputtering (MS), pulse DC MS, ARC MS Hybrid or High Power Impulse Magnetron Sputtering (HIPIMS). Each of the above processes provide sufficient ionization. However, MS operates at lower processing temperatures (100-500 C) and therefore is better suited for components rated at lower temperatures (e.g., automotive grade components).

In one embodiment, the PVD apparatus 12 is provided for depositing a film on a substrate 16 using MS. The substrate 16 represents a product (or plurality of products) prior to coating. The apparatus 12 includes a sealed chamber 18 that encloses the substrate 16. The chamber 18 is provided with a gas inlet 17 for receiving inert and reactive gases. The chamber also includes an outlet 19 connected to one or more pumps for regulating a pressure vacuum within the chamber 18, (generally between $10^{-6}$ and $10^{-7}$ torr).

A cathode 20 is also enclosed within the chamber 18. The cathode 20 includes a composite target bar comprising at least a portion of the elements that are to be deposited on the substrate 16. The cathode 20 contains at least one hard metal and at least one soft metal. The cathode 20 is formed with a high metal density, or percentage of metals to impurities of about 90-99.9 wt. %. In one embodiment, the cathode 20 comprises a metal density of about 97-98 wt. %.

The cathode 20 includes a higher concentration of the hard metal than the soft metal. In one embodiment, the cathode 20 is formed of a combination of a hard metal, such as molybdenum (Mo) and a soft metal, such as copper (Cu) with about 70 to 95 wt. % molybdenum and 5 to 30 wt. % copper. In another embodiment, the cathode 20 comprises about 75 to 90 wt. % molybdenum and 10 to 25 wt. % copper. In yet another embodiment the cathode 20 comprises about 82 to 87 wt. % molybdenum and 13 to 18 wt. % copper. In yet another embodiment the cathode 20 may comprise about 85 wt. % molybdenum and 15 wt. % copper.

Other embodiments of the system 10 include a cathode 20 with a composite target bar formed from other hard metals and soft metals, and combinations and alloys thereof. The metals are selected based on their ionic potential. The hard metal(s) may include: molybdenum (Mo), chromium (Cr), titanium (Ti), vanadium (V), tungsten (W), niobium (Nb), hafnium (Hf), zirconium (Zr), iron (Fe), aluminum (Al), silicon (Si) and yttrium (Y). And the soft metal(s) may include: copper (Cu), nickel (Ni), indium (In), tin (Sn), gallium (Ga), bismuth (Bi), silver (Ag), gold (Au), platinum (Pt), lead (Pb), palladium (Pd), and antimony (Sb). For example, in one embodiment, the system 10 includes a cathode 20 formed of a composite target bar including an alloy of copper and zinc, combined with an alloy of iron and silicon.

A cathode 20 formed from at least one of the above hard metals and at least one of the soft metals may be used to deposit nitride, carbide, carbonitride, or boride coatings. In these embodiments, the weight percentage of each of the alternative hard metals and soft metals are similar to the ranges given above for molybdenum and copper. For example, a cathode 20 may comprise about 70 to 95 wt. % hard metals and 5 to 30 wt. % soft metals.

In other embodiments of the system 10, multiple cathodes 20 may be simultaneously used. The multiple cathodes 20 may include pure target bars (one element) or composite target bars. For example, in one embodiment, the system 10 includes one cathode 20 containing copper (soft metal), and another cathode 20 containing molybdenum (hard metal).

The apparatus 12 when configured for MS, includes a magnet 22 for creating a magnetic field. The cathode 20 and the substrate 16 are each connected to a power supply. A cathode power supply 24 is connected to the cathode 20. The cathode power supply 24 provides a negative voltage between −1000 and −100 V to the cathode 20. A bias power supply 25 is connected to the substrate 16 for providing a bias voltage. Generally the bias voltage is between −300 and 0 V during deposition.

An inert gas 26, such as argon is provided to the inlet 17 and introduced into the chamber 18 in proximity to the cathode 20. The negative voltage applied to the cathode 20 causes the argon 26 to become excited and ignite to form plasma near the cathode 20. The plasma includes positive ions, which accelerate towards the surface of the cathode 20. The plasma is confined by the magnetic field to the face of the cathode 20. When the argon ions collide with the cathode 20 they cause target atoms (not shown), such as Cu and Mo atoms, to be ejected from the surface of the cathode 20.

A reactive gas 30 such as nitrogen, is provided to the inlet 17 and into the chamber 18 for reacting with the target atoms. The reactive gas 30 reacts with the target atoms to form a compound (not shown), such as CuMoN or $CuMo_2N$. The compound contacts the substrate 16 and deposits a film 32, such as CuMoN, on the substrate 16.

The apparatus 12 includes fixtures such as a rotation mechanism 36 for supporting and rotating the substrate 16. The rotating mechanism 36 is configured for rotating the substrate 16 through the plasma for facilitating an even distribution of the film 32 over the substrate 16 desired to be coated.

The apparatus 12 may also include a heater 38 for maintaining an elevated temperature within the chamber 18. Generally a temperature of 100 to 500 C is maintained within the chamber 18 during MS.

Additionally the apparatus 12 includes a controller 40 for controlling the operating parameters of the magnetron sputtering process. The controller 40 generally includes any number of microprocessors, ASICs, ICs, memory (e.g., FLASH, ROM, RAM, EPROM and/or EEPROM) and software code to co-act with one another to control the parameters of the apparatus 12 (e.g., temperature, pressure, voltage levels, orientation of the substrate 16, etc).

Figure 2:
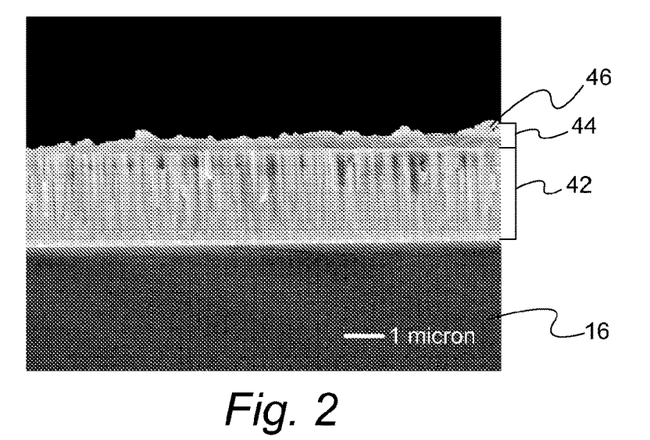
FIG. 2 is an enlarged sectional view of a product formed by the system of FIG. 1, illustrated prior to removing a top layer of a film.

Referring to FIGS. 1-4, the film 32 forms with two layers of varying composition. FIG. 2 illustrates a cross-sectional view of the substrate 16 and film 32. The film 32 includes a body or bulk layer 42 and a top or termination layer 44 formed over the bulk layer 42. The film 32 generally has a thickness of 0.3 to 10 μm. In one embodiment, the film 32 has a thickness of 0.75 to 3.5 μm.

The termination layer 44 forms on the surface of the bulk layer 42. The termination layer 44 is generally copper-rich, meaning that it has a higher concentration of copper than the bulk layer 42. The termination layer 44 forms nano-peaks 45, and may also form an unstructured portion 46.

The unstructured portion 46 includes oxides of copper and molybdenum formed from the reaction of copper and/or molybdenum with oxygen present in the chamber 18. This oxygen may be present due to water molecules, oxygen impurities in the cathode, remnants in the chamber, or other possible unintended sources.

The system 10 is configured for coating the substrate 16 to provide a product with high wear resistance and low friction attributes. However, the termination layer 44 generally has a lower hardness, due to the unstructured portion 46 and more surface roughness, due to the nano-peaks 45. Additionally, the termination layer 44 is less homogeneous than the bulk layer 42 of the film 32. The termination layer 44 also generally has less wear resistance than the bulk layer 42 and has a less uniform response to additives in lubricants. Therefore it is advantageous to eliminate the termination layer 44 by both mitigating the formation of the termination layer 44, and then removing any termination layer 44 that ultimately forms on the substrate 16.

Mitigating the termination layer 44 may be achieved by controlling certain operating parameters during the MS process. These parameters include the gas ratio within the chamber 18, magnetron powers, bias voltage and energy density.

The termination layer 44 may be mitigated by optimizing a gas ratio within the chamber 18. The gas ratio refers to the relative amount of the inert gas 26 to the reactive gas 30 within the chamber 18. The gas ratio influences the formation of the nano-peaks 45 (nitrides) within the deposited film 32. The nano-peaks 45 lead to counterface wear, and may be mitigated by maintaining a gas ratio within the chamber of about 60 to 70% inert gas, such as argon, to 30 to 40% reactive gas, such as nitrogen.

The termination layer 44 may also be mitigated by increasing energy density during the PVD process. Increasing the energy density results in greater ionization of the film 32 and smaller grain morphology. Increased energy density also leads to a resultant film 32 having decreased grain size, increased density and hardness, improved soft metal (Cu) dispersion and thinner soft metal boundary layers between Mo grains. The energy density may be increased by: optimizing spacing of the substrate 16, increasing process temperatures, and increasing plasma field energy.

Optimizing the spacing of the substrate 16 within the chamber 18, increases energy density, and mitigates the formation of the termination layer 44. Optimizing spacing refers to two related concepts: substrate 16 spacing; and substrate 16 to fixture spacing. Substrate 16 spacing refers to the relative mass of individual products of the substrate 16. Substrate 16 spacing varies the formation of the termination layer 44.

Substrate 16 to fixture spacing refers to the mass of the substrate 16 relative to the mass of the support fixture (rotation mechanism 36). The substrate 16 to fixture spacing increases by decreasing the mass of the support fixture, relative to the mass of the substrate 16. Increasing spacing results in an increase in the density of the deposited film 32 and a decrease in the thickness of the termination layer 44.

Increasing process temperature increases energy density, and mitigates the formation of the termination layer 44. The process temperature may be increased by increasing the voltage bias and increasing the temperature within the chamber 18.

The bias power supply 25 provides a bias voltage to the substrate 16. The bias voltage may be adjusted to alter the relative amounts of the sputtered elements in the film 32. The bias voltage corresponds to the amount of soft metal (Cu) content in the film 32. For example, the more negative the bias voltage, the less soft metal (Cu) is deposited on the substrate 16. In one embodiment the bias voltage is between −200 and −75 V, and in yet another embodiment it is approximately −150 V.

The ionization of the plasma and the sputtering rate can be adjusted by changing the power applied to the cathode 20 by the cathode power supply 24. Generally the cathode voltage is between −700 and −300 V. In at least one embodiment the cathode voltage is between −600 and −400 V, and in yet another embodiment it is approximately −500 V.

The termination layer 44 may also be mitigated by varying the magnetron target powers and bias voltage in "less copper in the film" direction by increasing the bias voltage and/or increasing the hard metal target power (if pure hard metal target is used) when getting close to the end of the deposition process.

Increasing the temperature within the chamber 18 increases energy density, and mitigates the formation of the termination layer 44. A temperature of 100 to 500 C is maintained within the chamber 18 during MS. Maintaining an operating temperature at the high end of the range helps mitigate the formation of the termination layer 44.

Increasing plasma field energy also increases energy density, and mitigates the formation of the termination layer 44. Plasma field energy is higher with ARC PVD or ARC-MS Hybrid PVD. However, ARC operates at higher process temperatures, which may be unsuitable for automotive grade components. HIPIMS provides high plasma field energy without increasing process temperatures by cycling the plasma field energy.

The termination layer 44 generally has a thickness of about 5 to 900 nm, depending on the amount of mitigation achieved. In one embodiment, the termination layer 44 has a thickness of about 100 to 400 nm. In yet another embodiment, the termination layer 44 has a thickness of 200 to 300 nm. The termination layer 44 thickness is generally at least partially proportional to the total film 32 thickness, such that a thicker film 32 will have a thicker termination layer 44.

The material removal apparatus 14 is provided for removing the remaining termination layer 44 after mitigation. In one embodiment, the material removal apparatus 14 is a polishing apparatus. The apparatus 14 is provided for removing the termination layer 44. The apparatus 14 includes a rotating disc 47. A soft cloth 48 is attached to the disc 47. Diamond paste 50 is applied to the cloth 48. The diamond paste 50 may include a particle size of about 0.5 to 5 μm. In another embodiment, the diamond paste 44 has a particle size of about 1 to 3 μm. Polishing is generally performed until the entire termination layer 44 is removed.

In other embodiments (not shown), the material removal apparatus may comprise one or more mechanical, chemical, and/or electrical alternatives to polishing. Mechanical material removal methods may include, but are not limited to, planing/shaping, milling, broaching, turning, grinding, honing, lapping, and/or superfinishing. Mechanical material removal generally comprises bringing a tool into contact with a work-piece with at least one of the tool and work-piece being in motion (either linearly or rotationally). Mechanical removal may also include the use of abrasives, such as in grinding honing, and superfinishing.

Chemical and/or electrical material removal may also be used alone or in conjunction with mechanical methods to remove the termination layer. Chemical/electrical removal can be accomplished by methods including, but not limited to, chemical milling, electrochemical machining, electric discharge machining, electron beam machining, laser machining, electrolytic grinding, or electropolishing. These methods are known in the art of material removal and will not be discussed in detail.

Because the termination layer 44 has reduced wear resistance compared to the bulk layer 42, the termination layer 44 may also be removed in situ by contact with a mating surface as a coated product is being used, tested, worn in, or otherwise utilized.

Figure 4:
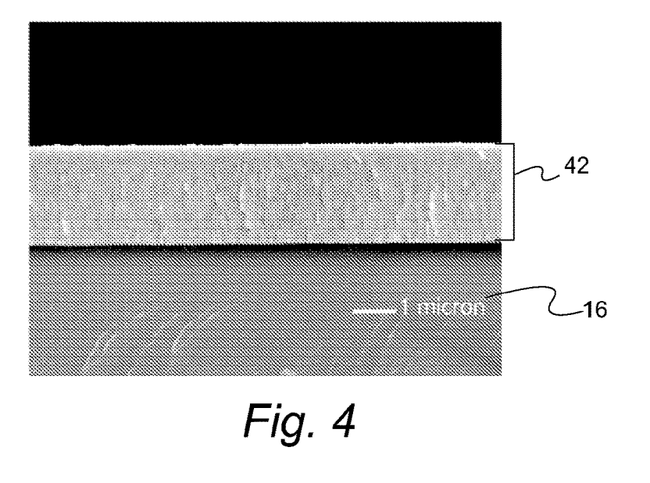
FIG. 4 is an enlarged sectional view of the product formed by the system of FIG. 1, illustrated after removing the top layer of the film.

The system 10 provides a product 52 having a bulk coating 54 formed on a substrate 16. The bulk coating 54 represents the film 32 after the termination layer 44 has been removed.

The bulk coating 54 formed by the system 10 is very hard and has high wear resistance. In at least one embodiment, the bulk coating 54 may have a hardness of at least 2,000 Vickers hardness (HV). In another embodiment, the bulk coating 54 may have a hardness of 2,000 to 6,000 HV. In yet another embodiment the bulk coating 54 may have a hardness of 2,500 to 5,000 HV. In yet another embodiment, the bulk coating 54 may have a hardness of 3,000 to 4,000 HV.

Figure 3:
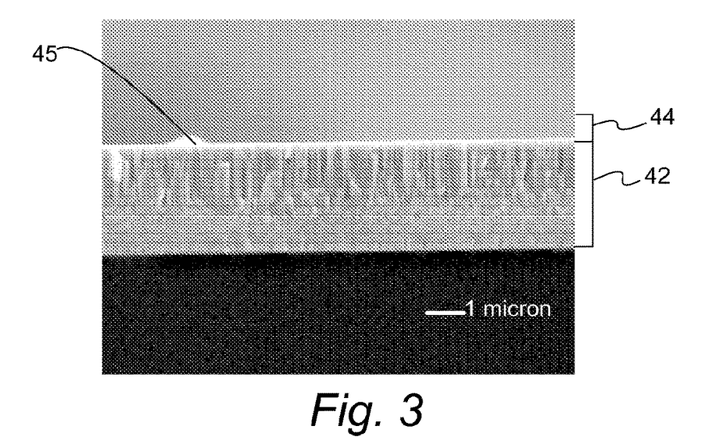
FIG. 3 is an enlarged sectional view of the product formed by the system of FIG. 1, illustrated after removing a portion of the top layer of the film.

FIGS. 2-4 illustrate the composition of the bulk coating 54 and the termination layer 44. FIG. 2 depicts a Scanning Electron Microscope (SEM) image of the bulk layer 42 and the termination layer 44. FIG. 3 depicts a SEM image of the termination layer 44 after the unstructured portion 46 has been removed. FIG. 4 depicts a SEM image of the bulk coating 54 once the termination layer 44 has been removed.

The final grain morphology of the molybdenum nitride bulk coating 54 after the magnetron sputtering process, is dense and equiaxed, with grains having a size of 5 to 100 nm. In one embodiment the grain size is 10 to 100 nm. In yet another embodiment, the grain size is 10 to 50 nm. The copper in the coatings is mostly located at the grain boundaries of the molybdenum nitride grains, generally a few atomic layers thick. In at least one embodiment, the copper is uniformly distributed throughout the bulk coating 54 at the grain boundaries.

Figure 5:
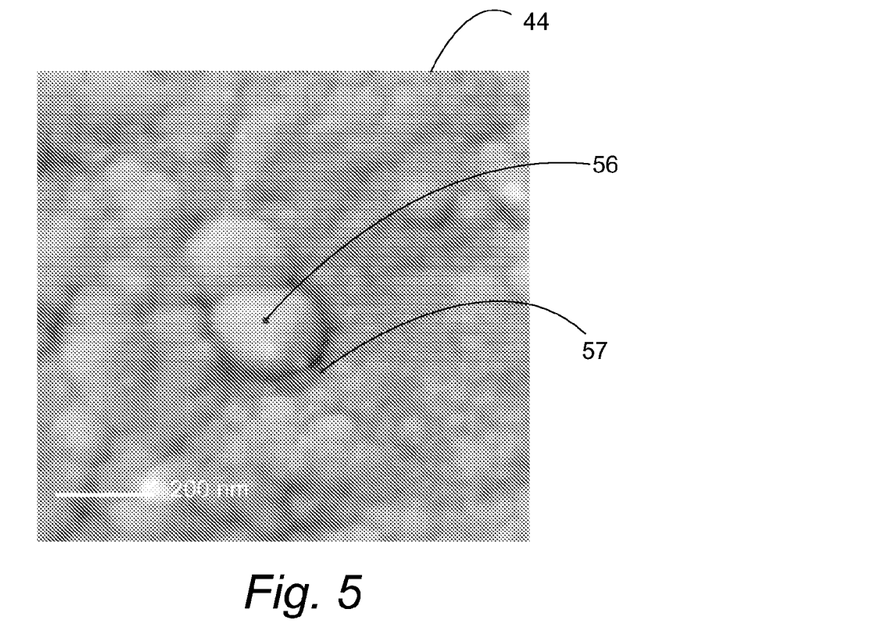
FIG. 5 is an enlarged view of the top layer of the film formed by the system of FIG. 1.
Figure 6:
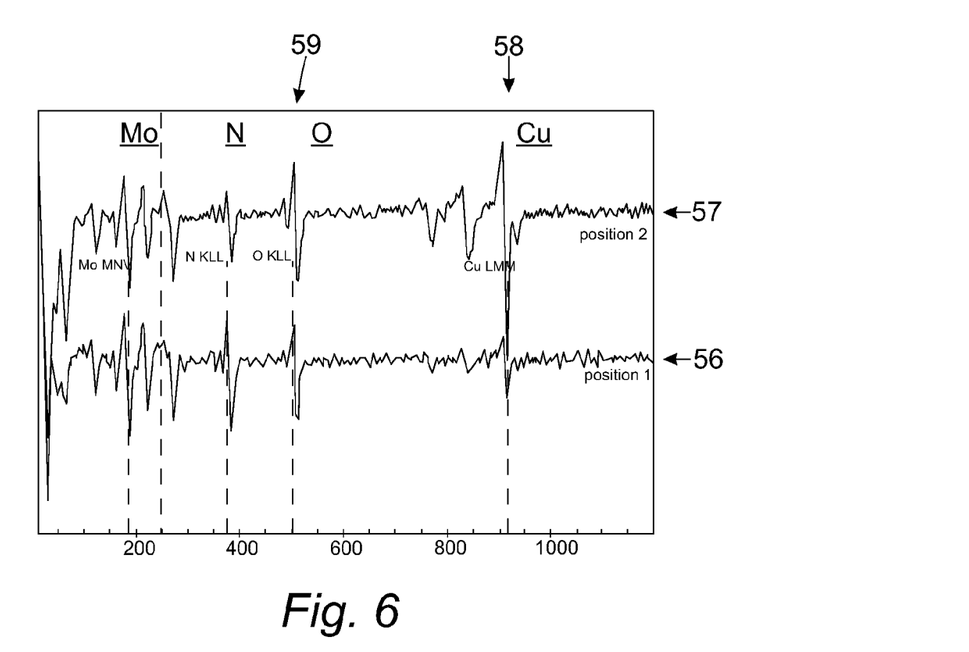
FIG. 6 is a relative composition plot of the top layer of FIG. 5.

FIGS. 5 and 6 illustrate the composition of the termination layer 44. FIG. 5 depicts a SEM image of the termination layer 44 formed on a substrate 16 by the apparatus 12. Multiple locations on the substrate 16 are selected for analysis, using scanning Auger electron microscopy (SAM). This technique allows for analysis of very thin surface layers (3-5 nm). Therefore the data given is from the very top surface of the film 32. A first position of the termination layer 44 is referenced by numeral 56 and is located at a central portion of a grain. A second position of the termination layer 44 is referenced by numeral 57 and is located at a grain boundary. FIG. 6 shows a plot of the relative composition of the termination layer 44 at each of the two positions. Region 1 of the plot is referenced by numeral 58 and illustrates the high concentration of Cu in the termination layer 44. Region 2 of the plot is referenced by numeral 59 and illustrates the high concentration of 0 in the termination layer 44. As noted above, the termination layer 44 is characterized by a high copper and oxide content. The copper content of the position 56 is about 10 at. %, while the position 57 has a copper content of about 25 at. %.

Figure 7:
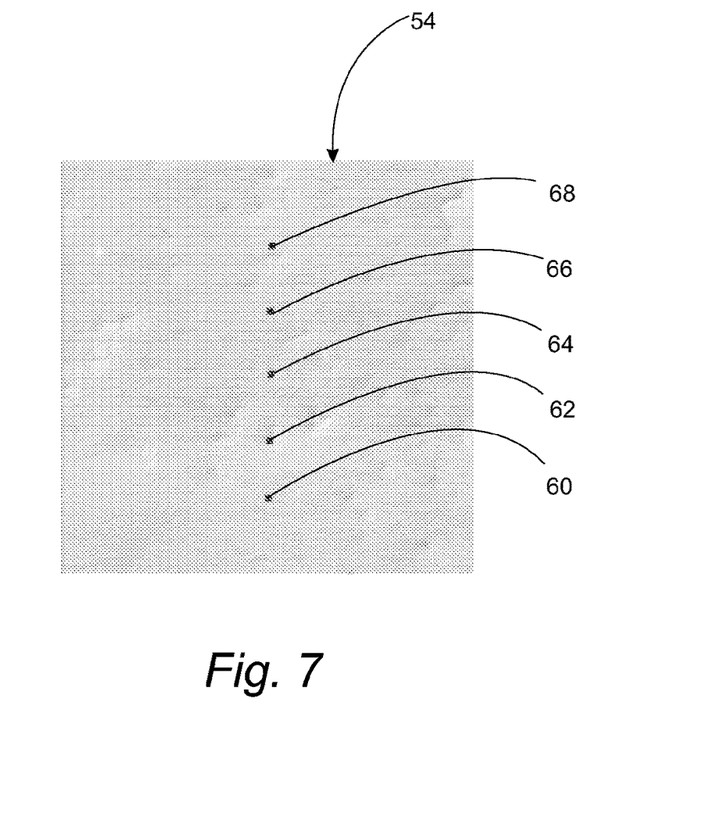
FIG. 7 is an enlarged view of an intermediate layer of the film formed by the system of FIG. 1.
Figure 8:
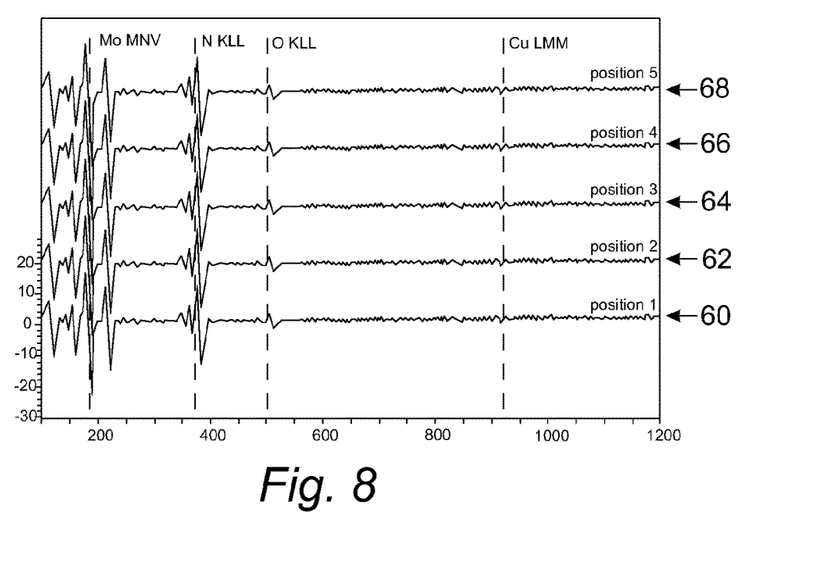
FIG. 8 is a relative composition plot of the intermediate layer of FIG. 7.

FIGS. 7 and 8 illustrate the composition of the bulk coating 54, once the termination layer 44 is removed. FIG. 7 depicts an SEM image of the bulk coating 54 formed on a substrate 16 by the apparatus 12. Five positions are selected for SAM analysis. A first position of the bulk coating 54 is referenced by numeral 60; a second position is referenced by numeral 62; a third position is referenced by numeral 64; a fourth position is referenced by numeral 66; and a fifth position is referenced by numeral 68. FIG. 8 shows a plot of the relative composition of the bulk coating 54 at each of the five positions. As shown in the plot, the relative compositions at each position 60, 62, 64 and 66 of the bulk coating 54 are relatively comparable to one another.

Additionally, when comparing FIG. 8 to FIG. 6, the positions 60, 62, 64, 66 and 68 of the bulk coating 54 have comparatively less copper and oxygen than the positions 56 and 57 of the termination layer 44 (FIG. 5). The copper content of these positions is about 3.2±0.3 at. %.

Figure 9:
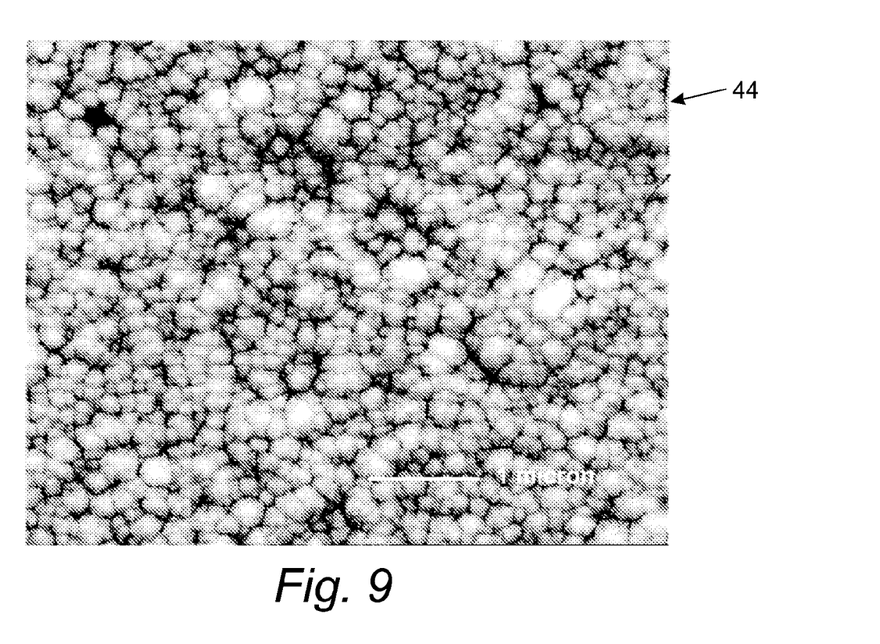
FIG. 9 is another enlarged view of the top layer of the film formed by the system of FIG. 1.
Figure 10:
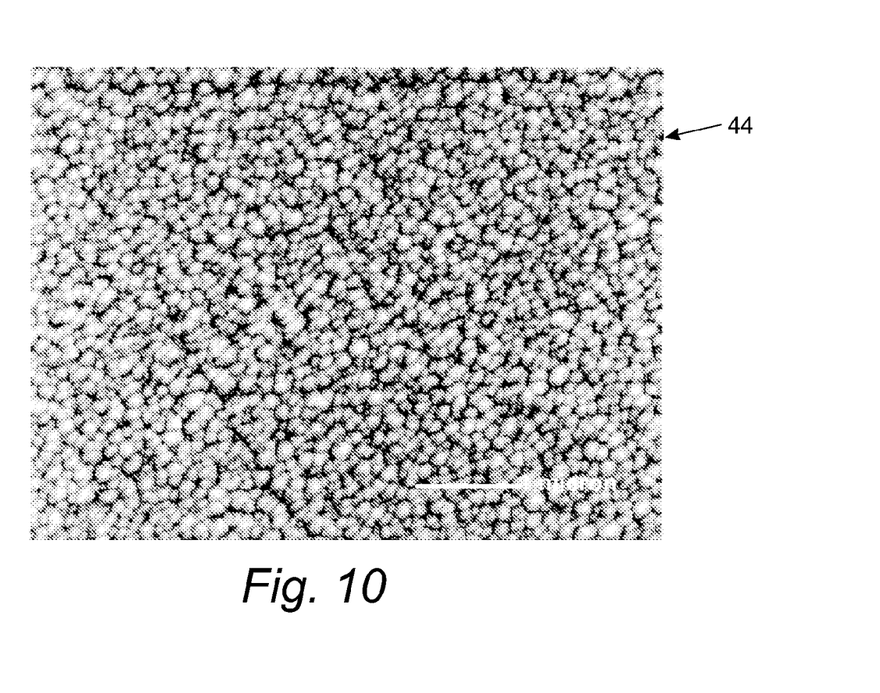
FIG. 10 is yet another enlarged view of the top layer of the film formed by the system of FIG. 1.

FIGS. 9 and 10 illustrate the effect of substrate 16 to fixture spacing on the composition of the bulk coating 54 and the termination layer 44. FIG. 9 depicts a SEM image of a termination layer 44 formed on a substrate that was mounted to a high mass fixture, where the mass and volume of the fixture is high compared to the relative mass of the substrate. FIG. 10 depicts a SEM image of a termination layer 44 formed on a substrate that was mounted to a low mass fixture, where the mass and volume of the fixture is low compared to the relative mass of the substrate.

In this example, all coating processes (e.g., temperature, time, and voltages) were constant and the only variable was spacing. A comparison of FIGS. 9 and 10 illustrates that increasing spacing, by decreasing the mass of the fixture, results in an increase in the density of the deposited film 32.

Figure 11:
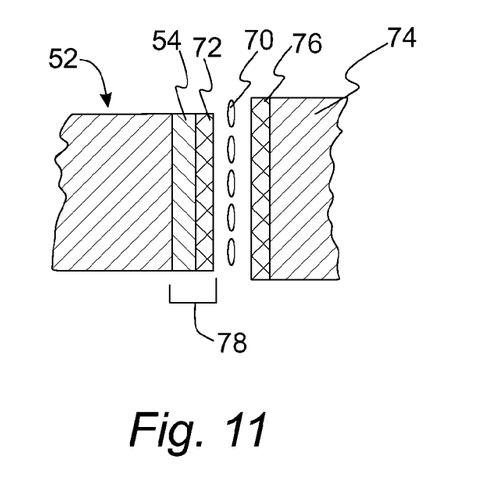
FIG. 11 is a sectional view of the product formed by the system of FIG. 1, and illustrated in an operating environment.

With reference to FIG. 11, the product 52 is adapted for operating in an environment having high temperature and high pressure (e.g. within an engine or fuel system). The bulk coating 54 reacts chemically with liquid hydrocarbons 70 (e.g., fuels, oils, and lubricants) to induce the formation of a very low friction film. The film is adapted to collect, or scavenge additives, modifiers or naturally occurring compounds from the liquid hydrocarbons 70 to form a tribological layer 72 on the product 52. Common additives and modifiers used in automotive liquid hydrocarbons 70 include: Extreme Pressure Additives ("EP Compounds"), Friction Modifiers ("FM Compounds"), Rust Inhibitors ("RI Compounds") and Detergent Additives ("DA Compounds"). Naturally occurring compounds (e.g., sulfer) may be present in environments where additives and modifiers are minimized (e.g., fuel injection systems).

The tribological layer 72 is concentrated on a contact interface between the product 52 and a counterface 74. FIG. 11 is provided for illustrative purposes and depicts the tribological layer 72 covering the bulk coating 54, however the tribological layer 72 is actually concentrated at areas where loading and/or friction occurs. The tribological layer 72 attaches to the surface of the product 52 by strong ionic and covalent bonds. The tribological layer 72 has a thickness of 20 angstroms to 200 nm, depending on the type of additive, modifier or compound scavenged.

The tribological layer 72 is continuously replenished by further chemical reactions. This continuous replenishment or "active" formation of the tribological layer 72 allows for significant reductions in the amount of required additives, both EP and FM compounds, that are added to the liquid hydrocarbons 70, yet still maintain sufficient protection. This large scale reduction of such additives can improve the toxicity of such oils, fuels and/or lubricants.

The tribological layer 72 may form even in the presence of limited liquid hydrocarbons 70. The high degree of induced concentration and formation of such compounds and additives on the contact surface areas allows for formation of this protective and beneficial tribological layer 72, even when very low amounts of liquid hydrocarbons 70 are present in the operating environment.

The tribological layer 72 persists despite long periods of non-use of the machine in which the coated component is found providing superior startup protection after such long periods of non-use.

The bulk coating 54 and the tribological layer 72 collectively form a coating 78. The coating 78 provides low friction coefficients. In at least one embodiment, the coating 78 has a friction coefficient of 0.005 to 0.1 when tested in a liquid hydrocarbon 70, such as a fully formulated motor oil.

In another embodiment, the coating 78 has a friction coefficient of 0.01 to 0.05 when tested in the liquid hydrocarbon 70.

The tribological layer 72 may transfer to the uncoated counterface 74 to form a transferred tribological layer 76. The transferred tribological layer 76 is chemically similar to the tribological layer 72 present on the product 52.

The transferred tribological layer 76 differs from other temporary tribological effects normally present (such as EP additives on uncoated steel) by the nature of the chemo-mechanical bonding of the transferred tribological layer 76 to the counterface 74. This bonding is not as transitory or momentary in nature as it would be in an uncoated, steel-on-steel, friction interface.

Examples of the coating 78 and a method of forming the coating 78 will be described below. The following examples are given to help in understanding the invention and are not meant to be limiting with respect to materials, procedures, or conditions given.

Example 1

A copper molybdenum-nitride coating was deposited on a substrate using magnetron sputtering. Sputtering was performed using a cathode having a composition of 90 wt. % Mo and 10 wt. % Cu in an atmosphere comprising approximately 33% nitrogen and approximately 66% argon. The cathode voltage was approximately 400 V and the bias voltage was approximately 150 V. The sputtering yielded a film with a hardness of 2391 HV pl. Hardness testing was performed prior to polishing using a Fischer H100C XYP tester with a 20 mN load.

The substrate was polished using a diamond polishing machine comprising a soft cloth supported on a rotating disk and using diamond paste with a particle size of 1 to 3 μm. Polishing removed the termination layer, resulting in a bulk coating. The bulk coating had a composition comprising about 95 to 99.8 wt. % MoN/Mo2N and about 0.2 to 5 wt. % copper. The bulk coating had a thickness of about 1.5 to 2 μm, and a hardness of about 2835 HV pl, using the Fischer H100C XYP tester with a 20 mN load.

Example 2

A copper molybdenum-nitride coating was deposited on a substrate using magnetron sputtering. Sputtering was performed using a cathode having a composition of 90 wt. % Mo and 10 wt. % Cu in an atmosphere comprising approximately 36% nitrogen and approximately 64% argon at a pressure of $3.22*10^{-3}$ mbar. The cathode voltage was approximately 525 V and the bias voltage was approximately 150 V. The sputtering yielded a film with a hardness of 2046 HV pl. Hardness testing was performed prior to polishing using a Fischer H100C XYP tester with a 20 mN load.

The substrate was polished using a manual polishing operation comprising a silicon paper with 2000 grit. Polishing removed the termination layer, resulting in a bulk coating. The bulk coating had a composition comprising about 95 to 99.8 wt. % MoN/Mo2N and about 0.2 to 5 wt. % copper. The bulk coating had a thickness of about 1.5 to 2 μm, and a hardness of 2525 HV pl, using the Fischer H100C XYP tester with a 20 mN load.

Example 3

A copper molybdenum-nitride coating was deposited on a substrate using ARC MS Hybrid Sputtering. Sputtering was performed using a cathode having a composition of 90 wt. % Mo and 10 wt. % Cu in an atmosphere comprising approximately 33% nitrogen and approximately 66% argon at a pressure of $x*10^{-3}$ mbar. The sputtering yielded a film with a hardness of 3265 HV pl. Hardness testing was performed prior to polishing using a Fischer H100C XYP tester with a 50 mN load.

The substrate was polished using a diamond polishing machine comprising a soft cloth supported on a rotating disk and using diamond paste with a particle size of 1 to 3 μm. Polishing removed the termination layer, resulting in a bulk coating. The bulk coating had a composition comprising about 95 to 99.8 wt. % MoN/Mo2N and about 0.2 to 5 wt./at. % copper. The bulk coating had a thickness of about 1.5 to 2 μm, and a hardness of about 3475 HV pl, using the Fischer H100C XYP tester with a 50 mN load.

While exemplary embodiments are described above, it is not intended that these embodiments describe all possible forms of the invention. Rather, the words used in the specification are words of description rather than limitation, and various changes may be made without departing from the spirit and scope of the invention. Additionally, the features of various implementing embodiments may be combined to form further embodiments of the invention.

What is claimed is:

1. A method of forming a metal nitride coating on a substrate to be exposed to hydrocarbons, the method comprising:
   providing a substrate in a chamber;
   providing at least one cathode in the chamber, the at least one cathode containing at least one soft metal and at least one hard metal;
   providing nitrogen in the chamber;
   depositing a film onto the substrate by physical vapor deposition (PVD), the film including a bulk layer and an outer termination layer, each of the bulk layer and the outer termination layer including the at least one soft metal and the at least one hard metal, the at least one soft metal increasing a hardness of bulk layer to at least 2,000 Vickers (HV);
   mitigating the deposition of the termination layer; and
   removing the termination layer from the film, leaving the remaining bulk layer disposed over the substrate;
   wherein when the substrate is exposed to hydrocarbons in an environment having at least one of wear additives, friction modifiers and naturally occurring compounds, a durable tribological layer is formed on an outer surface of the bulk layer to create a coating having low friction and anti-wear properties.

2. The method of claim 1 wherein the at least one soft metal is selected from a group consisting of:
   copper, nickel, indium, tin, gallium, bismuth, silver, gold, platinum, lead, palladium, antimony and zinc.

3. The method of claim 2 wherein the at least one hard metal is selected from a group consisting of:
   molybdenum, chromium, titanium, vanadium, tungsten, niobium, halfnium, zirconium, iron, aluminum, silicon and yttrium.

4. The method of claim 1 further comprising providing a cathode in the chamber comprising 70 to 97 wt. % molybdenum and 3 to 30 wt. % copper.

5. The method of claim 1 further comprising:
   providing an inert gas in the chamber.

6. The method of claim 5 wherein the inert gas includes argon.

7. The method of claim 6 further comprises providing a gas ratio of about 60 to 70% argon to about 30 to 40% nitrogen.

8. The method of claim 1 further comprising transferring a portion of the durable tribological layer to a counterface.

9. The method of claim 1 wherein PVD comprises a magnetron sputtering process.

10. The method of claim 9 further comprising applying a bias voltage of −75 to −200 V to the substrate and applying a voltage of −100 to −1000 V to a cathode.

11. The method of claim 9 wherein the magnetron sputtering process is performed at a temperature of 100 to 500 C.

12. The method of claim 1 wherein mitigating the deposition of the termination layer further comprises utilizing a switching power supply provided to a cathode for increasing deposition energy.

13. The method of claim 1 wherein mitigating the deposition of the termination layer further comprises utilizing a pulsing power supply provided to a cathode for increasing deposition energy.

14. The method of claim 1 wherein mitigating the deposition of the termination layer further comprises increasing ionization of the bulk coating during deposition for increasing deposition energy.

15. The method of claim 1 wherein mitigating the deposition of the termination layer further comprises increasing ionization of the bulk coating during deposition for forming a more dense bulk coating having smaller grain size.

16. The method of claim 1 wherein mitigating the deposition of the termination layer further comprises providing separate heating during the deposition process.

17. The method of claim 1, wherein removing the termination layer further comprises polishing the termination layer of the film having a thickness of 100 to 400 nm.

18. The method of claim 17 wherein polishing further comprises rotating a member having a surface covering with a diamond paste disposed thereon, the diamond paste having a particle size of 0.1 to 5 μm.

19. The method of claim 17 wherein polishing further comprises rotating a member having a fabric surface covering with a particle size of 0.1 to 5 μm.

20. The method of claim 1 wherein removing the termination layer further comprises chemical stripping the termination layer of the film having a thickness of 100 to 400 nm.

21. The method of claim 1, wherein the at least one soft metal increases the hardness of the bulk layer to 2,500 to 5,000 Vickers (HV).

22. The method of claim 1, wherein the bulk layer deposited by physical vapor deposition (PVD) includes grains of the at least one hard metal and the at least one soft metal is distributed in a boundary film surrounding the grains.

23. The method of claim 1, wherein when the substrate is exposed to hydrocarbons in an environment having at least one of wear additives, friction modifiers and naturally occurring compounds, the durable tribological layer formed has a friction coefficient of 0.01 to 0.05.

* * * * *